US007199862B2

(12) United States Patent
Sewell

(10) Patent No.: US 7,199,862 B2
(45) Date of Patent: Apr. 3, 2007

(54) BEAM-SPLITTER OPTICS DESIGN THAT MAINTAINS AN UNFLIPPED (UNMIRRORED) IMAGE FOR A CATADIOPTRIC LITHOGRAPHIC SYSTEM

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/272,147

(22) Filed: Nov. 14, 2005

(65) Prior Publication Data

US 2006/0061748 A1 Mar. 23, 2006

Related U.S. Application Data

(63) Continuation of application No. 10/807,268, filed on Mar. 24, 2004, now Pat. No. 6,972,830, which is a continuation of application No. 10/307,407, filed on Dec. 2, 2002, now Pat. No. 6,731,374.

(51) Int. Cl.
G03B 27/54 (2006.01)
G03B 27/42 (2006.01)
G03B 27/70 (2006.01)
G03B 17/00 (2006.01)

(52) U.S. Cl. .............................. 355/67; 355/53; 355/66; 359/730

(58) Field of Classification Search .................. 355/53, 355/66, 67, 71, 77; 359/727, 730, 731, 732
See application file for complete search history.

(56) References Cited

U.S. PATENT DOCUMENTS 5,089,913 A 2/1992 Singh et al.

(Continued)

FOREIGN PATENT DOCUMENTS

JP 6-181161 A 6/1994
JP 9-246179 A 9/1997

OTHER PUBLICATIONS

Danish Search Report for Singapore Appln. 200306876-4, mailed Jul. 23, 2004.

(Continued)

*Primary Examiner*—Alan Mathews
(74) *Attorney, Agent, or Firm*—Sterne, Kessler, Goldstein & Fox P.L.L.C

(57) ABSTRACT

The present invention is a catadioptric system having a reticle optical group, a beam splitter, an aspheric mirror, a baffle plate, a folding mirror and a semiconductor wafer optical group. The reticle optical group, the beam splitter and the semiconductor wafer optical group are placed on the same beam axis, different from aspheric mirror and folding mirror axis. The light passes through an image pattern on the reticle and is reflected by the beam splitter onto the aspheric mirror. The aspheric mirror reflects the light back through the beam splitter onto the folding mirror. The folding mirror reflects the light back to the beam splitter. The beam splitter reflects the light onto the semiconductor wafer optical group. A plurality of quarter wave plates can be placed in optical paths between optical elements of the present invention to change polarization of an incoming light. Before light passes through the semiconductor wafer optical group, it passes through the baffle plate, which prevents any background scattered light caused by internal reflections within the beam splitter from entering the semiconductor wafer optical group. In another embodiment, a spacer plate is inserted into the beam splitter. The spacer plate creates an offset between reticle optical group beam axis and semiconductor wafer optical group beam axis. This reduces direct passage of light from reticle optical group to semiconductor wafer optical group.

14 Claims, 6 Drawing Sheets

U.S. PATENT DOCUMENTS

| | | | |
|---|---|---|---|
| 5,592,329 A * | 1/1997 | Ishiyama et al. | 359/399 |
| 5,636,066 A | 6/1997 | Takahashi | |
| 5,793,473 A | 8/1998 | Koyama et al. | |
| 5,796,524 A | 8/1998 | Oomura | |
| 5,808,805 A * | 9/1998 | Takahashi | 359/651 |
| 5,959,784 A | 9/1999 | Seki et al. | |
| 6,081,382 A | 6/2000 | Omura | |
| 6,424,471 B1 * | 7/2002 | Ulrich et al. | 359/732 |
| 6,480,330 B1 | 11/2002 | McClay et al. | |
| 6,522,483 B2 * | 2/2003 | Kreuzer | 359/727 |
| 6,590,718 B2 | 7/2003 | Fürter et al. | |
| 6,717,746 B2 * | 4/2004 | Epple et al. | 359/727 |
| 6,731,374 B1 | 5/2004 | Sewell | |
| 6,757,110 B2 | 6/2004 | Sewell et al. | |
| 6,972,830 B2 * | 12/2005 | Sewell | 355/67 |
| 6,977,716 B2 | 12/2005 | Sewell et al. | |
| 2002/0167734 A1 | 11/2002 | Schuster | |
| 2004/0174617 A1 | 9/2004 | Sewell | |

OTHER PUBLICATIONS

Written Opinion for Singapore Patent Appln. No. 200306876-4, 10 pages, dated Apr. 8, 2005.

European Search Report, Appl. No. EP 03 02 7402, 4 pages, mailed Jan. 11, 2006.

* cited by examiner

BEAM-SPLITTER OPTICS DESIGN THAT MAINTAINS AN UNFLIPPED (UNMIRRORED) IMAGE FOR A CATADIOPTRIC LITHOGRAPHIC SYSTEM

CROSS REFERENCE TO RELATED APPLICATIONS

This application is a continuation of U.S. application Ser. No. 10/807,268, filed Mar. 24, 2004 (now U.S. Pat. No. 6,972,830, issued Dec. 6, 2005), which is a continuation of U.S. application Ser. No. 10/307,407 (now U.S. Pat. No. 6,731,374, issued May 4, 2004), entitled "Beam-Splitter Optics Design That Maintains An Unflipped (Unmirrored) Image For A Catadioptric Lithographic System," filed Dec. 2, 2002, which is incorporated by reference herein in its entirety.

BACKGROUND OF THE INVENTION

1. Field of the Invention

This invention relates to an improved lithography system and method. More specifically, this invention relates to a lithography system and method using catadioptric exposure optics that projects high precision images without image flip.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. The image refers to the original, or source, image being exposed. The projected image refers to the image that actually contacts the surface of the wafer. While exposure optics are used in the case of photolithography, a different type of exposure apparatus may be used depending on the particular application. For example, x-ray or photon lithographies each may require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semi-conductive, or insulative layers. This process is then repeated, together with other steps, until the desired features have been formed on the surface of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Exposure optics comprise refractive and/or reflective elements, i.e., lenses and/or mirrors. Currently, most exposure optics used for commercial manufacturing consist only of lenses. However, the use of catadioptric (i.e., a combination of refractive and reflective elements) exposure optics is increasing. The use of refractive and reflective elements allow for a greater number of lithographic variables to be controlled during manufacturing. The use of mirrors, however, can lead to image flip problems.

There is a need for an optical system design that is capable of producing an unflipped (unmirrored) image on a semi-conductor wafer. Furthermore, this optical system should be backward compatible to reticle designs in earlier catadioptric systems. Finally, there is a need for an optical system design capable of uniform and symmetric heat distribution in order to reduce a burden of thermal compensation system.

BRIEF SUMMARY OF THE INVENTION

The present invention relates to a catadioptric lithographic exposure apparatus for forming an image pattern on a semiconductor wafer. Specifically, the present invention is a catadioptric lithographic system including a reticle optical group, a beam splitter, an aspheric mirror optical group, a folding mirror and a semiconductor wafer optical group. The light beam passes through an image pattern formed on the reticle onto the beam-splitter cube, where it is reflected onto the aspheric mirror. The aspheric mirror reflects the light beam back through the beam-splitter cube. A quarter wave plate, placed in an optical path between the aspheric mirror and the beam-splitter cube, changes polarization of the light entering the beam-splitter cube. After passing through the beam-splitter cube, the folding mirror, placed adjacent the beam-splitter cube, reflects the light beam. Another quarter wave plate, placed in an optical path between the fold mirror and the beam-splitter cube, changes polarization of the light entering the beam-splitter cube. Then, the light beam is reflected by the beam-splitter cube onto the wafer optical group. The wafer optical group magnifies, focuses and/or aligns the light beam, which subsequently forms a pattern on the semiconductor wafer. The pattern on the semiconductor wafer corresponds to the image pattern on the reticle.

In an embodiment of the present invention, a baffle plate is inserted between the beam splitter cube and the wafer optical group. The baffle plate serves to absorb a background scattered light generated as a result of internal reflections within the beam-splitter cube. The background scattered light is generated as a result of light beams passing through the beam-splitter cube and reflecting off beam splitter cube surfaces. Furthermore, the baffle plate substantially absorbs the background scattered light and does not reflect it back into the beam-splitter cube.

In another embodiment of the present invention, the beam-splitter cube includes two optical prism halves separated by a spacer plate. The width of the spacer plate is a variable in an offset created between the image axis of the object plane beam and the wafer plane beam. The object plane beam passes from the object plane through the reticle group of optics. The wafer plane beam passes through the wafer group. The width of the spacer plate depends on the amount of desired offset between the image axis of the object plane beam and the wafer plane beam. The width can be zero (in other words, optical surfaces of the two optical prism halves are in optical contact) in one embodiment or can vary in alternative embodiments. The width of the spacer plate determines the amount of background scattered light that is incident on the baffle plate and the wafer group. The spacer plate can be manufactured from a similar optical material as the optical prism halves of the beam-splitter cube. Furthermore, in an alternative embodiment, the beam-splitter cube includes two optical prism halves separated by a plurality of spacer plates. The plurality of spacer plates more effectively correct for bierefringence.

The systems and methods in the present invention provide a relatively uniform heat distribution. By allowing a double pass through the beam-splitter cube, the present invention symmetrically distributes heat generated by the passage of light through the system. This reduces the burden of the thermal compensation system.

Moreover, using the systems and methods in the present invention the light, passing from the reticle optical group, is folded an even number of times. This does not yield image mirroring and prevents improper flipped image formation on the semiconductor wafer.

Further features and advantages of the present invention as well as the structure and operation of various embodiments of the present invention are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 3a illustrates a light beam's travel path in the embodiment of the present invention shown in FIG. 2a.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE INVENTION

Table of Contents

1. Overview.
2. Terminology.
3. Beam-splitter Optics Design.
   a. Beam Splitter Optics Design Without Spacer Plate.
   b. Image Path in Beam Splitter Optics Design Without Spacer Plate.
   c. Beam Splitter Optics Design With Spacer Plate.
   d. Image Path in Beam Splitter Optics Design With Spacer Plate.
4. Conclusion.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

1. Overview.

The present invention relates to lithographic systems and methods using catadioptric exposure optics that project high quality images without image flip. The present invention allows for a more efficient and timely production of semiconductors.

Figure 1:
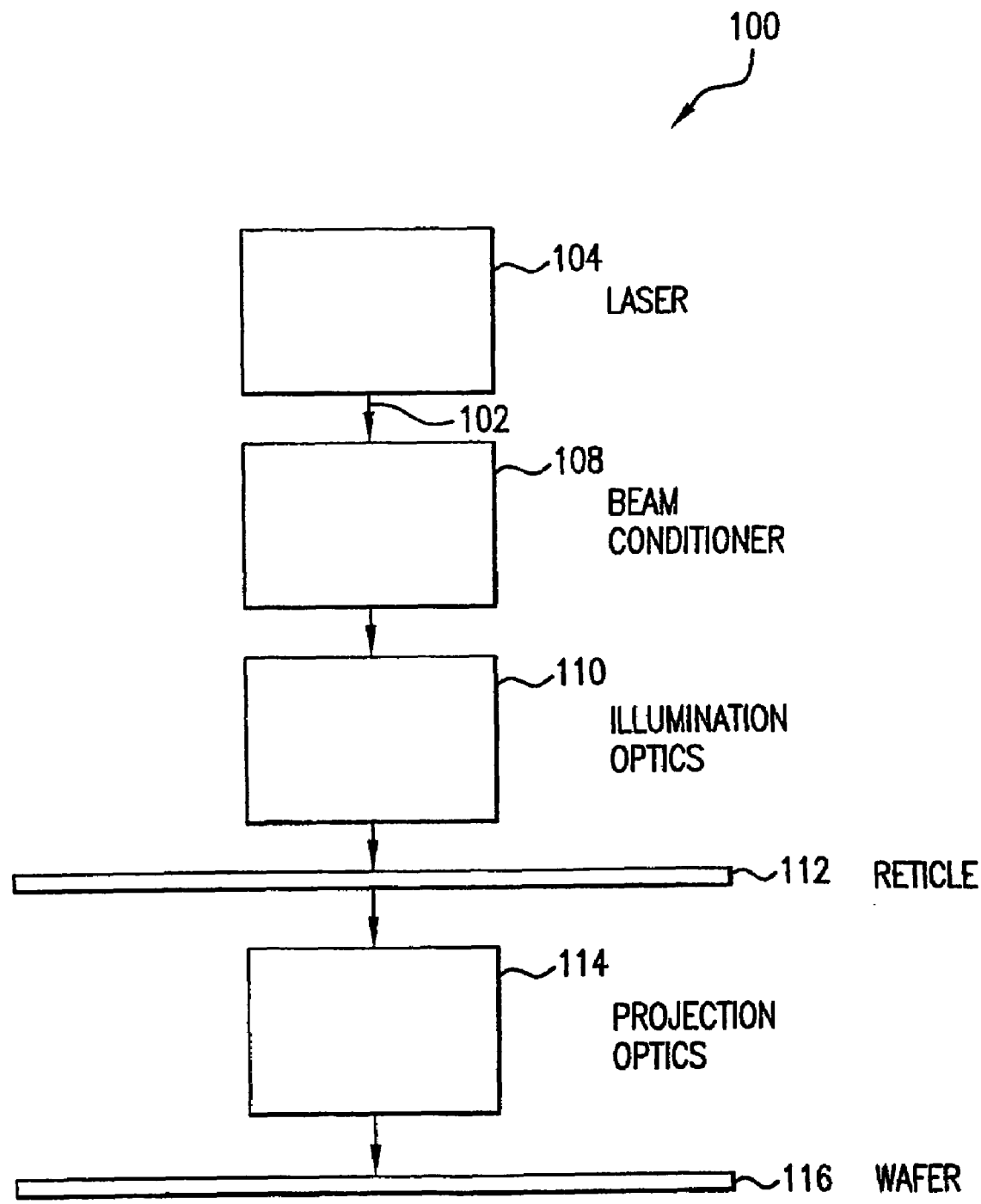
FIG. 1 illustrates a system where an embodiment of the present invention can be implemented.

FIG. 1 illustrates an exemplary environment where the present invention can be implemented. A system 100 for expanding light 102 emitted from a light source (e.g., a laser) 104 without changing spatial coherence of the light 102, and which substantially eliminates speckle patterns is shown in FIG. 1. The laser 104 can be an excimer, deep UV excimer laser, or the like. The light 102 is received by a beam conditioner 108. The beam conditioner 108 outputs light to illumination optics 110, which in turn transmits light through a mask or reticle 112 onto a substrate 116 via projection optics 114. One embodiment for this system can be a lithography system, or the like.

2. Terminology.

To more clearly delineate the present invention, an effort is made throughout the specification to adhere to the following term definitions as consistently as possible.

"Aspheric mirror" is a mirror that has a non-spherical surface. The aspheric surface of a mirror can be used in a catadioptric optical system to advance or retard an incident electromagnetic energy wavefront relative to the reflective action of a spherical surface.

"Beam splitter" is an optical device for dividing a beam into two or more separate beams. A simple beam splitter may be a very thin sheet of glass inserted in the beam at an angle to divert a portion of the beam in a different direction. A more sophisticated type consists of two right-angle prisms cemented together at their hypotenuse faces. The cemented face of one prism is coated, before cementing, with a metallic or dielectric layer having the desired reflecting properties, both in the percentage of reflection and the desired color. In a color television camera, for example, a three-way beam splitting prism is employed in which multilayer films are deposited on the interfaces to divert red and green light to two vidicons, leaving the blue image to pass through to the third vidicon tube. In lithography systems, the beam splitter is capable of passing through the light, having the same polarity as the beam splitter, and reflecting the light having different polarity from the beam splitter.

"Catadioptric optical system" means an optical system whose focal power is achieved using both reflection and refraction. While the relative powers of the lenses and mirrors in a catadioptric optical system vary from system to system, such systems are typically characterized by the use of reflective surfaces to achieve a significant portion of the systems focal power, in combination with refractive surfaces of little or zero focal power. These systems produce an image that has improved aberrational characteristics.

"Intermediate image" is an image formed prior to a final focal plane in an optical system.

"Quarter wave plate" is a plate made of a double-refracting crystal having such a thickness and a refractive index difference that a phase difference of one-quarter cycle is formed between the ordinary and extraordinary elements of light passing through.

"Reticle" is an optical element located at an image plane, containing a pattern that assists in pointing an instrument or measuring target characteristics. It may be as simple as a pair of crossed lines or a complex pattern. In semiconductor pattern generation, it is a glass or quartz substrate bearing the image of an integrated circuit.

"Wafer" is a cross-sectional slice cut from an ingot of either single-crystal, fused, polycrystalline or amorphous material that has refined surfaces either lapped or polished. Wafers are used either as substrates for electronic device manufacturing or as optics. Typically, they are made of silicon, quartz, gallium arsenide or indium phosphide. The terms "wafer" and "substrate" are used in this application interchangeably.

3. Beam-splitter Optics Design a. Beam Splitter Optics Design Without Spacer Plate.

Figure 2A:
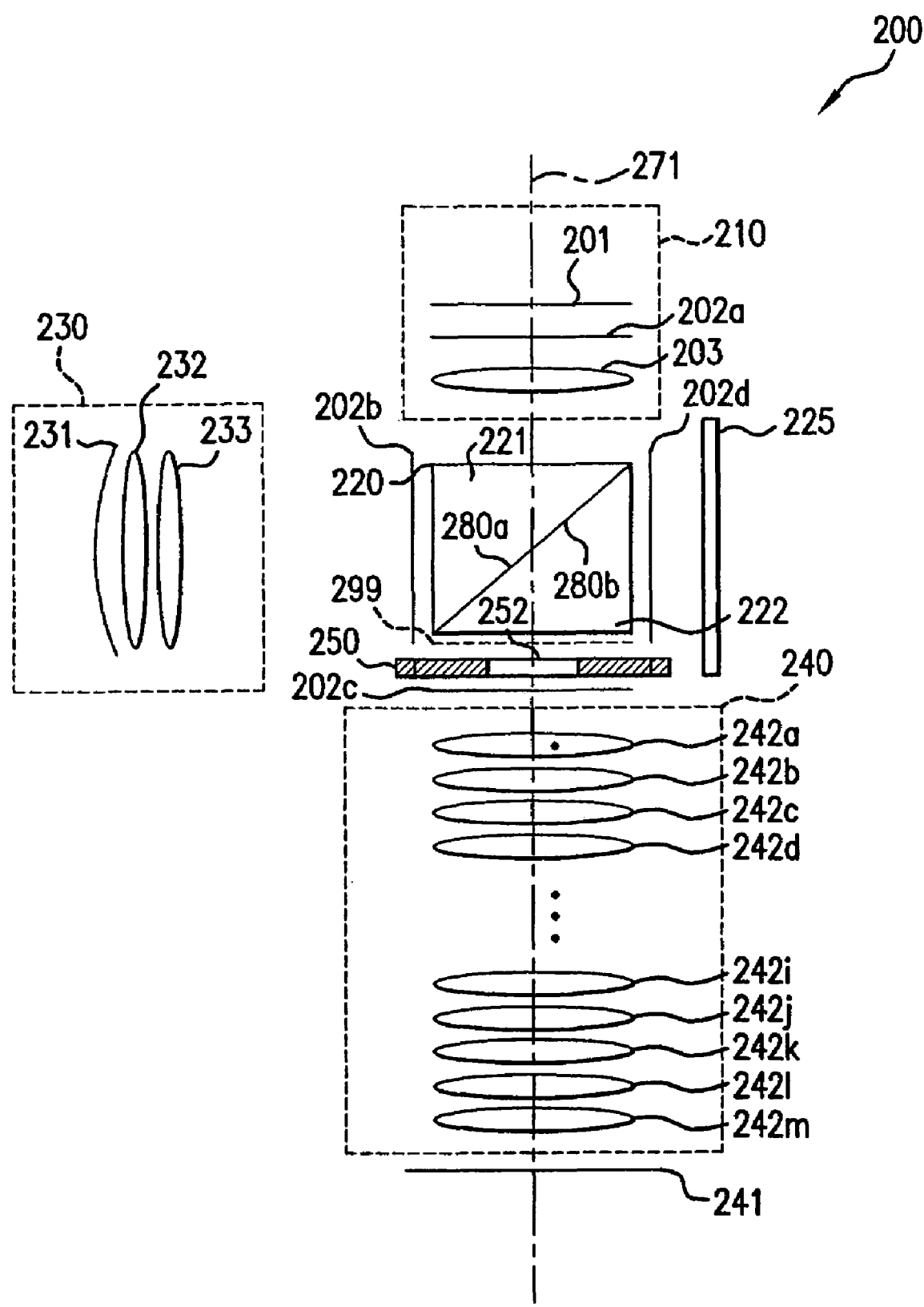
FIG. 2a illustrates an embodiment of the present invention showing a beam splitter cube without a spacer plate.
Figure 2B:
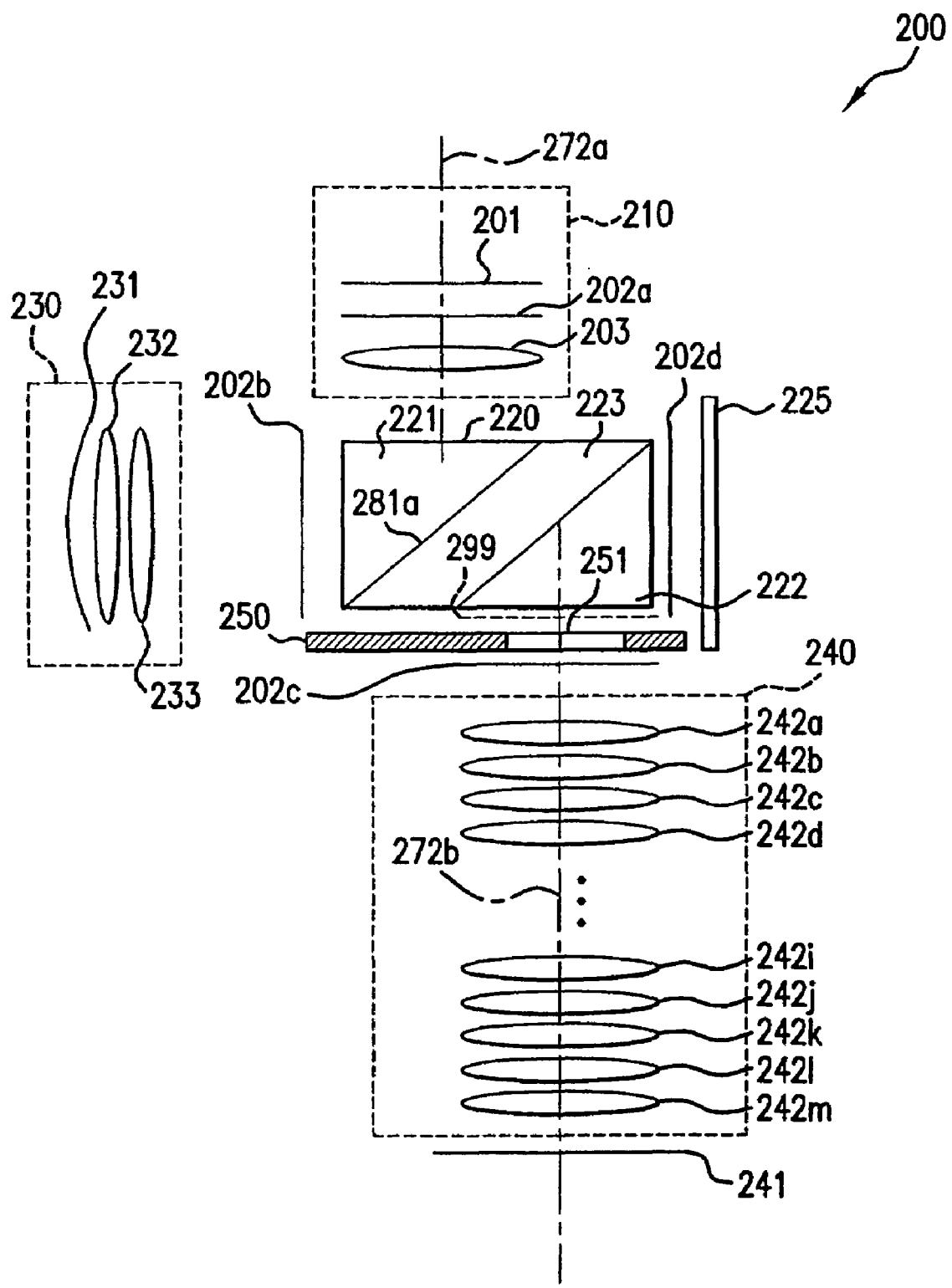
FIG. 2b illustrates an embodiment of the present invention showing the beam splitter cube with the spacer plate.
Figure 3A:
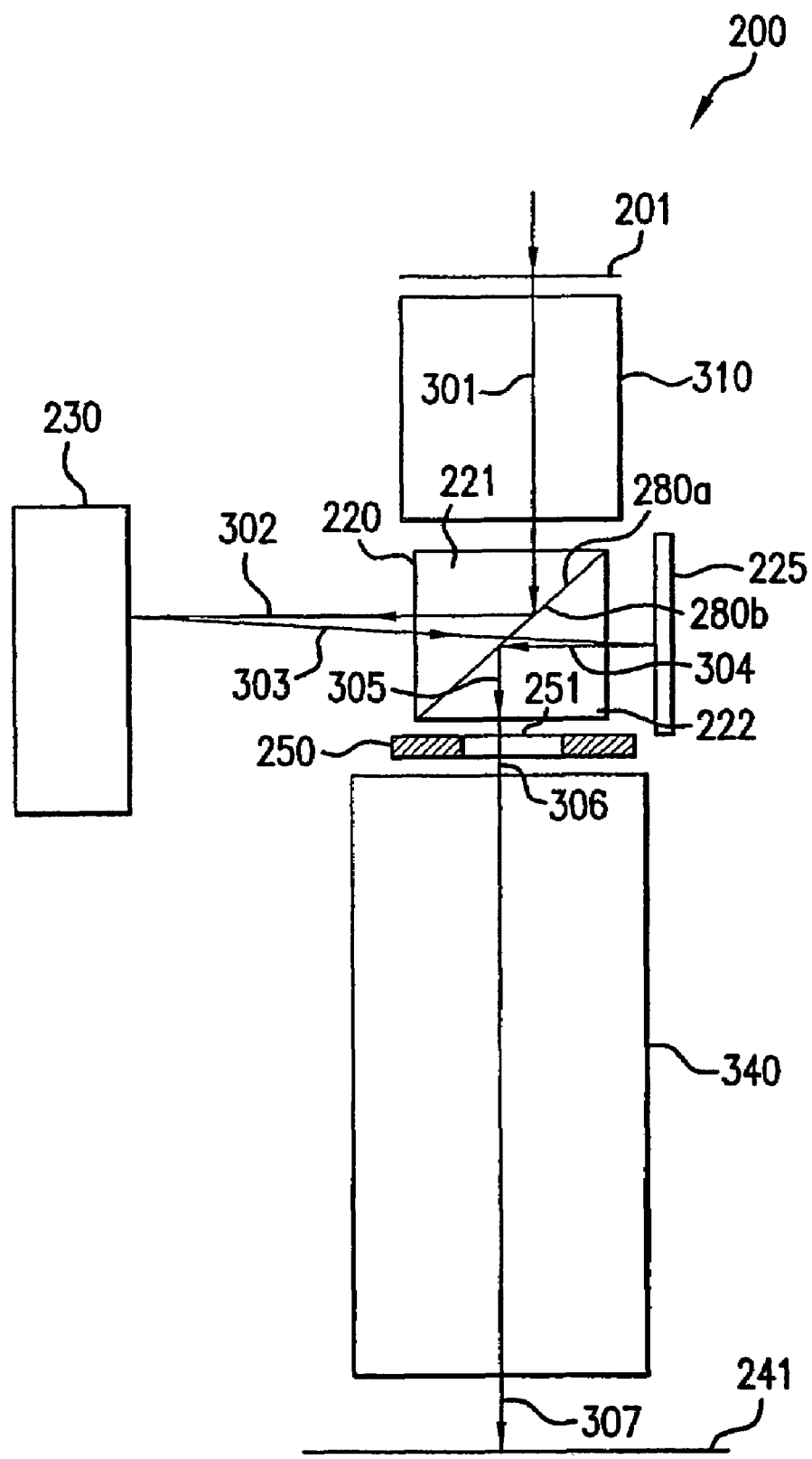
Figure 3B:
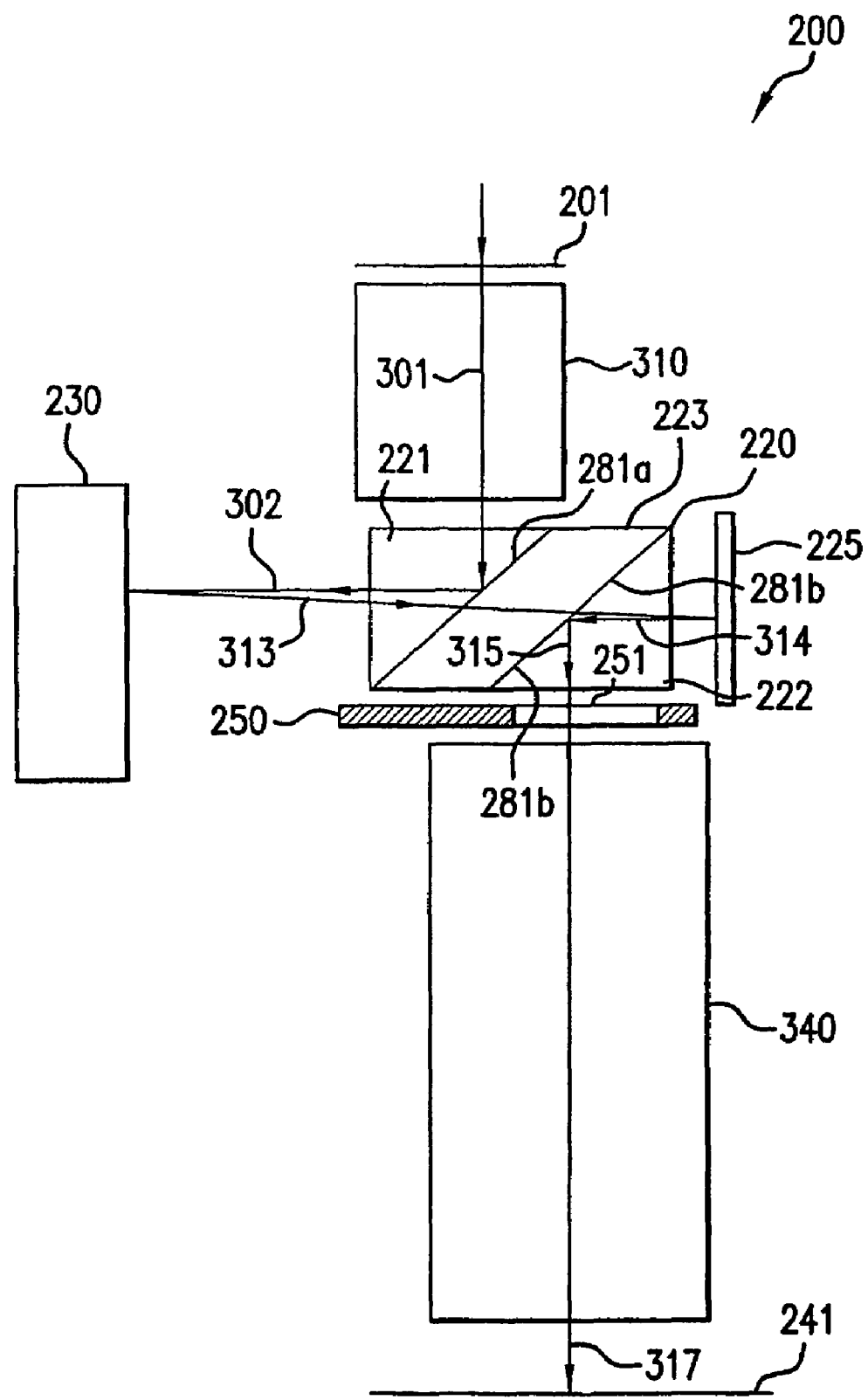
FIG. 3b illustrates a light beam's travel path in the embodiment of the present invention shown in FIG. 2b.

FIG. 2a illustrates an embodiment of the present invention having a beam splitter cube without a spacer plate. FIG. 2b illustrates another embodiment of the present invention having the beam splitter cube with the spacer plate. FIG. 3a illustrates a light beam's travel path in FIG. 2a embodiment. FIG. 3b illustrates a light beam's travel path in FIG. 2b embodiment.

FIG. 2a illustrates a catadioptric system 200 according to an embodiment of the present invention. Catadioptric system 200 has a reticle optical group 210, a beam splitter 220, an aspheric mirror optical group 230, a folding mirror 225, a baffle plate 250, a wafer optical group 240 and a plurality of quarter wave plates 202(a, b, c, d).

Reticle optical group 210 is adjacent beam splitter cube 220. Wafer optical group 240 is also adjacent beam splitter cube 220. Reticle optical group 210 is across wafer group 240, such that beam splitter cube 220 separates reticle optical group 210 and wafer optical group 240.

Aspheric mirror optical group 230 is adjacent beam splitter cube 220. Folding mirror 225 is also adjacent beam-splitter cube 220. Aspheric mirror optical group 230 is across folding mirror 225, such that beam splitter cube 220 separates aspheric mirror optical group 230 and folding mirror 225. As shown in FIG. 2a, reticle optical group 210 and wafer optical group 240 are on the same optical axis. Also, aspheric mirror optical group 230 and folding mirror 225 are on the same optical axis. However, the optical axis of reticle optical group 210 and wafer optical group 240 can be different from the optical axis of aspheric mirror optical group 230 and folding mirror 225 (see FIG. 3a). As would be apparent to one having ordinary skill in the relevant art that other configurations of each optical object in catadioptric system 200 are possible.

Reticle optical group 210 includes a reticle 201, a quarter wave plate 202a and a reticle lens 203. Quarter wave plate 202a is placed between reticle 201 and reticle lens 203. Reticle lens 203 is adjacent beam splitter cube 220. In an embodiment, reticle lens 203 can have a positive or negative refractive power.

Aspheric mirror optical group 230 includes an aspheric mirror 231, a first aspheric mirror lens 232 and a second aspheric mirror lens 233. First aspheric mirror lens 232 is between aspheric mirror 231 and second aspheric mirror lens 233. In an embodiment, first aspheric mirror lens 232 has a positive refractive power and second aspheric mirror lens 233 has a negative refractive power. Quarter wave plate 202b separates aspheric mirror optical group 230 and beam splitter cube 220. Quarter wave plate 202b is adjacent second aspheric mirror lens 233 and beam splitter cube 220. In an embodiment, aspheric mirror 231 is a concave mirror.

Quarter wave plate 202d separates folding mirror 225 and beam splitter cube 220. In an embodiment, folding mirror 225 is a flat mirror. In another embodiment, folding mirror is a mirror having optical power.

Wafer optical group 240 has a plurality of wafer group lenses 242(a, b, . . . m). Wafer group lenses 242(a, b, . . . m) are placed between a semiconductor wafer 241 and beam splitter cube 220. In an embodiment, wafer group lenses 242(a, b, . . . m) have a different refractive power. In other words, some wafer group lenses have a positive refractive power and some wafer group lenses have a negative refractive power. For example, wafer group lens 242a has a positive refractive power and wafer group lens 242i has a negative refractive power.

Baffle plate 250 and quarter wave plate 202c separate beam splitter cube 220 from wafer optical group 240. Baffle plate 250 is adjacent beam splitter cube 220 and quarter wave plate 202c. Quarter wave plate 202c is adjacent lens 242a of wafer optical group 240 and baffle plate 250.

Beam splitter cube 220 includes a first prism 221 and a second prism 222, as shown in FIG. 2a. First prism 221 is adjacent second prism 222. Furthermore, first prism 221 is adjacent quarter wave plate 202b and reticle lens 203. Whereas, second prism 222 is adjacent quarter wave plate 202d and baffle plate 250. First prism 221 includes a first optical surface 280a. Second prism 222 includes a second optical surface 280b. First optical surface 280a is adjacent second optical surface 280b.

In an embodiment of the present invention, one function of reticle optical group 210 is to initially process a beam of light. An image pattern formed on reticle 201 is the image pattern to be formed on semiconductor wafer 241. Reticle optical group 210 focuses, magnifies and/or aligns the light entering through reticle 201.

Beam splitter cube 220 is a polarized mirror. Thus, the light of the same polarity as beam splitter cube 220 can pass through it, while light of a different polarity is reflected by it. Also, the light is able to enter and leave beam splitter cube 220, if it has the same polarity as quarter wave plates 202(a, b, c, d). Because beam splitter cube includes first prism 221 adjacent to second prism 222, the light is reflected directly onto aspheric mirror optical group 230, due to Snell's Law (i.e., the angle of incidence is equal to the angle of reflection).

Aspheric mirror 231 increases the magnitude of an incoming image reflected by beam splitter cube 220. Quarter wave plate 202b, placed in an optical path between aspheric mirror 231 and beam splitter 220, reverses the polarity of light carrying an incoming image reflected by beam splitter cube 220. Because of change in polarity, the light is able to enter and pass through beam splitter cube 220. Aspheric mirror 231 performs these tasks, as well as any other potential tasks, in a manner which is known to those skilled in the art of the present invention.

Folding mirror 225 receives the light reflected by aspheric mirror 231 and passed through beam splitter cube 220. Quarter wave plate 202d, placed in an optical path between folding mirror 225 and beam splitter cube 220, reverses polarity of the light and reflects it back into beam splitter cube 220. In an embodiment, folding mirror 225 is a flat mirror without any optical power. In another embodiment, folding mirror 225 has a power and further magnifies and/or aligns the light coming from beam splitter cube 220.

Baffle plate 250 prevents light from leaking through beam splitter cube 220. The light entering beam splitter cube 220 is reflected by various optical surfaces within beam splitter cube 200 (for example, first optical surface 280*a* and second optical surface 280*b*). The light is reflected along a certain optical axis. However, some light is scattered throughout the beam splitter cube 220 and is not reflected along the optical axis. This creates background scattered light, which causes distortion in the image formation at the semiconductor wafer 241. The baffle plate 250 serves to absorb, filter, block or otherwise prevent such background scattered light. Baffle plate 250 substantially prevents the background scattered light from causing distortion in the image formation at the semiconductor wafer 241. Baffle plate 250 absorbs any background scattered light resulting from internal reflection within beam splitter cube 220. Two images form at baffle plate 250 when the light is reflected by various optical surfaces in catadioptric system 200 (e.g., first optical surface 280*a*, second optical surface 280*b*, and others). First image is a concentrated image of the image pattern formed on reticle 201. Second image is a spread-out image (caused by the background scattered light) of the image pattern formed on reticle 201. The concentrated image is the desired image and the spread-out image is not. Therefore, in order to prevent image distortion on semiconductor wafer 241, baffle plate 250 absorbs the spread-out image and passes the concentrated image to the wafer group 240. In an embodiment, baffle plate 250 is made of any well known material capable of absorbing light.

Figure 4:
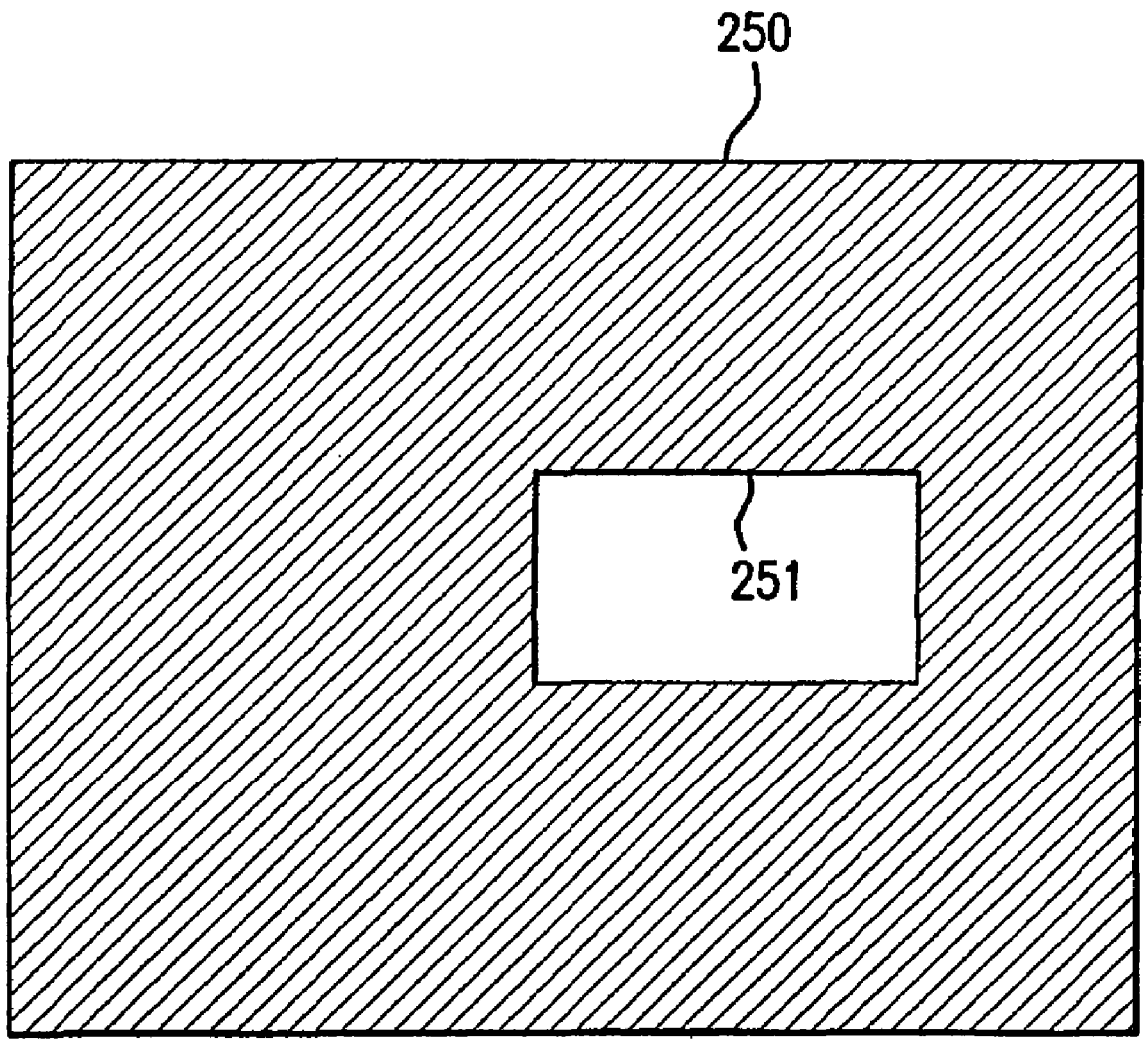
FIG. 4 illustrates an embodiment of a baffle plate in the present invention.

FIG. 4 illustrates baffle plate having an opening 251. Opening 251 passes through the light beam carrying the concentrated image of the pattern formed on reticle 201. The size, shape and location of opening 251 on the baffle plate 250 are application specific. Furthermore, size and shape of the baffle plate 250 is application specific, as well. The baffle plate 250 can be made of any metallic, plastic or any other material capable of absorbing, filtering, blocking or otherwise preventing the background scattered light of substantially all wavelengths. It is understood by one having ordinary skill in the art that other embodiments of baffle plate 250 are possible. In an alternative embodiment, the size of opening 251 is 30 mm×26 mm.

Turning again to FIG. 2*a*, this embodiment of the catadioptric system 200 has reticle group 210, beam splitter cube 220 and wafer group 240 on the same optical axis 271. This affects the final image formed on semiconductor wafer 241. Furthermore, because these optical groups are located on the same optical axis 271, there is a possibility that the light, directed from reticle 201, will pass directly through the beam splitter cube 220 onto wafer optical group 240 without being reflected by the beam splitter cube 220. Thus, this light constitutes the background scattered light (described above), which produces a distortion in the image formed on semiconductor wafer 241. Therefore, the baffle plate 250 minimizes the amount of this background scattered light that reaches semiconductor wafer 241.

Wafer group 240 receives focused image from beam splitter cube 220. In an embodiment, lenses 142(*a*, *b*, . . . *m*) of wafer group 240 magnify and align the image. Lenses 142 can have various refractive powers. The magnified and/or aligned light forms a pattern on semiconductor wafer 241, which is identical to the image pattern on reticle 201.

b. Image Path in Beam Splitter Optics Design Without Spacer Plate.

FIG. 3*a* illustrates the light beam path in FIG. 2*a* embodiment of catadioptric system 200. In this embodiment, the light enters through reticle 201 and passes through reticle group of lenses 310. Light 301 is magnified, focused and/or aligned by reticle group of lenses 310. Reticle optical group 210 of FIG. 2*a* includes reticle 210 and reticle group of lenses 310.

Subsequently, light 301 enters first prism 221 of beam splitter cube 220. Beam splitter cube 220 reflects light 301. Specifically, the first optical surface 280*a* of first prism 221 reflects light 301. Aspheric mirror optical group 230 receives reflected light 302. Quarter wave plate 202*b* (not shown in FIG. 3*a*), placed in an optical path between aspheric mirror 231 and beam splitter cube 220 changes polarization of light 302. Optical objects of aspheric mirror optical group 230 further focus, magnify and/or align light before aspheric mirror 231 reflects light 302.

After polarization change, polarized light 303 passes back into beam splitter cube 220. The optical objects in aspheric mirror optical group 230 magnify and/or align image represented by polarized light 303 before light 303 enters beam splitter cube 220. Polarized light 303 passes through beam splitter cube 220, because light 303 and beam splitter cube 220 have the same polarity.

Folding mirror 225 receives polarized, focused light 303 and reflects it back into beam splitter cube 220. Quarter wave plate 202*d* (not shown in FIG. 3*a*) placed in an optical path between folding mirror 225 and beam splitter cube 220, reverses polarity of light 303 and reflects it as polarized light 304. Polarized light 304 has the same polarity as second prism 222 of beam splitter cube 220. Second prism 222 reflects light 304 towards wafer group 340 and semiconductor wafer 241. Specifically, second optical surface 280*b* of second prism 222 reflects light 304. Light beam 304 becomes light beam 305.

After reflection by second prism 222, light 305 passes through baffle plate 250. Light 305 forms an intermediate image 299 (as shown in FIG. 2*a*). Intermediate image 299 forms before light 305 passes through baffle plate 250. Light beam 305 carries the concentrated image and the spread-out image of reticle 201 image pattern. After passing through baffle plate 250, baffle plate 250 eliminates the spread-out image and passes through light 306 carrying the concentrated image. Baffle plate 250 absorbs any background scattered light within beam splitter cube 220.

Light 306 passes through wafer optical group 340, where it is further focused, magnified and/or aligned by the optical objects within wafer optical group 340. Light beam 306 becomes focused, magnified and/or aligned light beam 307. Focused, magnified and/or aligned light 307 forms an image pattern on semiconductor wafer 241. The image pattern on semiconductor wafer 241 is identical to the image pattern formed on reticle 201.

An advantage of this design, is that optical objects (i.e., reticle optical group 210, beam splitter cube 220, aspheric mirror optical group 230, etc.) in catadioptric system 200 reflect light an even number of times. This eliminates a possibility of image mirroring. First prism 221 reflects light, passing through reticle 201, the first time. Aspheric mirror 231 reflects the light second time and directs it through beam splitter 220 onto folding mirror 225. Folding mirror 225 reflects the light third time back into second prism 222 of beam splitter cube 220. Second prism 222 reflects light fourth time onto wafer optical group 340 and semiconductor wafer 241. Because the light is reflected an even number of times, the image pattern formed on semiconductor wafer 241 is not mirrored.

c. Beam Splitter Optics Design With Spacer Plate.

FIG. 2b illustrates another embodiment of catadioptric system 200. FIG. 2b shows reticle optical group 210, aspheric mirror optical group 230, beam splitter cube 220, folding mirror 225, baffle plate 250, and wafer optical group 240 and quarter wave plates 202(a, b, c, d). The components and functions of reticle group 210, aspheric mirror optical group 230, folding mirror 250, and wafer optical group 240 are similar to FIG. 2a embodiment.

Referring back to FIG. 2b, beam splitter cube 220 includes first prism 221, a spacer plate 223 and second prism 222. Spacer plate 223 separates first prism 221 and second prism 222. Reticle group 210 is adjacent first prism 221. Reticle group lens 203 is adjacent first prism 221. Aspheric mirror optical group 230 is adjacent first prism 221. Folding mirror 225 is adjacent second prism 222. Baffle plate 250 is adjacent spacer plate 223. Wafer optical group 240 is adjacent second prism 222. In an embodiment, spacer plate 223 may be manufactured from the same optical material as first prism 221 and second prism 222.

Spacer plate 223 creates an offset between axis 272a of reticle optical group 210 and axis 272b of wafer optical group 240. As compared with FIG. 2a, there is no single axis 271 for reticle optical group 210 and wafer optical group 240. Therefore, spacer plate 223 eliminates some of the background scattered light in beam splitter cube 220.

Furthermore, spacer plate 223 has two separate beam splitter surfaces 281a and 281b. First beam splitter surface 281a is within first prism 221. Second beam splitter surface 281b is within second prism 222. First beam splitter surface 281a of spacer plate 223 is not adjacent to second beam splitter surface 281b of spacer plate 223. This is different from FIG. 2a embodiment, where first optical surface 280a is adjacent second optical surface 280b. In FIG. 2b, the light reflects off of two different surfaces within beam splitter cube 220. This is different from FIG. 2a embodiment, where light reflects off of first optical surface 280a and second optical surface 280b.

Because spacer plate 223 creates an offset between reticle optical axis 272a and wafer optical axis 272b, it helps to prevent generation of background scattered light when the light passes from the reticle optical group 210 directly through the beam splitter cube 220 onto wafer optical group 240. The width of the spacer plate 223 can be changed or otherwise predetermined according to the amount of light allowed to pass through the beam splitter cube 220 from the reticle optical group 210 onto wafer optical group 240. Therefore, the wider the spacer plate 223, the lesser amount of light that is allowed to pass directly through the beam splitter cube 220 without being reflected of off optical surfaces within beam splitter cube 220. The narrower the spacer plate 223, the greater amount of light that is allowed to pass directly through the beam splitter cube 220. Thus, the width of the spacer plate 223 is application specific, i.e., it depends on the amount of light that the designer wants to pass directly through the beam splitter cube 220 from reticle optical group 210 onto wafer optical group 240.

Even though the spacer plate 223 controls the amount of background scattered light that passes directly through the beam splitter cube 220, the light directed from the reticle optical group generates additional background scattered light. The additional background scattered light is caused by internal reflections within beam splitter cube 220. Because of the internal reflections within beam splitter cube 220, the background scattered light forms a spread-out image at the baffle plate 250 before light enters the wafer optical group 240, as described above.

In an alternative embodiment, spacer plate 223 can include a plurality of spacer plates. The plurality of spacer plates can have a multi-layered arrangement and can be manufactured from similar optical material as first prism 221 and second prism 222. Furthermore, the plurality of spacer plates are better able to correct for birefringence. This embodiment produces a more coherent light beam that is reflected out from the beam-splitter cube 220 and eventually generates an image on the wafer.

Therefore, a combination of baffle plate 250 and spacer plate 223 controls the amount of light passing directly through the beam splitter 220 and background scattered light in beam splitter cube 220 caused by internal reflections. Baffle plate 250 serves to block any spread-out image that forms at baffle plate 250. Baffle plate 250 does not block concentrated image that also forms at the baffle plate.

In one embodiment, folding mirror 225 is a flat mirror. In another embodiment, folding mirror 225 has optical power. Similar to FIG. 2a, this allows further focusing, alignment and/or magnification of light.

d. Image Path in Beam Splitter Optics Design With Spacer Plate.

FIG. 3b illustrates image path of a beam of light in FIG. 2b embodiment of catadioptric system 200. FIG. 3b illustrates reticle 201, reticle optics 301, beam splitter cube 220 with spacer plate 223, aspheric mirror optical group 230, folding mirror 225, baffle plate 250, wafer optics 340 and semiconductor wafer 241.

Beam of light 301 enters catadioptric system 200 through an image pattern on reticle 201 and passes through reticle optics 310. Subsequently, light beam 301 enters first prism 221 of beam splitter cube 220. First prism 221 reflects light 301 with first beam splitter surface 281a onto aspheric mirror optical group 230. Light beam 301 becomes reflected light beam 302.

Aspheric mirror optical group 230 focuses, magnifies and/or aligns light beam 302. Aspheric mirror 231 (not shown in FIG. 3b) reflects light beam 302. Quarter wave plate 202b (not shown in FIG. 3b), placed in an optical path between aspheric mirror 231 and beam splitter cube 220, changes light's 302 polarization. Light beam 302 becomes polarized light beam 313.

Light beam 313 now passes through beam splitter cube 220, because light beam 313 and beam splitter cube 220 (including first prism 221, spacer plate 223, and second prism 222) have the same polarity. After passing through beam splitter cube 220, folding mirror 225 reflects light beam 313 back into the beam splitter cube 220. Quarter wave plate 202d (not shown in FIG. 3b), placed in an optical path between folding mirror 225 and beam splitter cube 220, changes polarization of the light beam 313. Light beam 313 becomes polarized light beam 314.

Subsequently, light beam 314 enters second prism 222 of beam splitter cube 220. Second prism 222 reflects light beam 314 with second beam splitter surface 281b onto wafer optics 340. Light beam 314 becomes reflected light beam 315.

Light beam 315 represents a concentrated image, or intermediate image 299 (FIG. 2b), of the image pattern formed on reticle 201. Intermediate image 299 forms before light beam 315 passes baffle plate 250 and enters wafer group optics 340. The spread out image forms at baffle plate 250. The background scattered light resulting from beam splitter cube 220 internal reflections causes formation of the spread-out image. Baffle plate 250 blocks the spread out image from entering wafer group optics 340 and negatively affecting image on semiconductor wafer 241.

Furthermore, spacer plate 223 creates an offset between reticle optics axis 272a and wafer optics axis 272b. Therefore, light beam 301 does not pass to wafer optics group 340 through beam splitter cube 220, as in the embodiment shown in FIG. 2a.

Referring back to FIG. 3b, wafer optics 340 further magnify and/or align light beam 315. Light beam 315 becomes light beam 317. Light beam 317 represents a more focused and/or aligned concentrated image of the pattern on reticle 201. Subsequently, light beam 317 forms an image on semiconductor wafer 241.

Similarly to FIG. 2a design, an advantage of this design, is that optical objects (i.e., reticle optical group 210, beam splitter cube 220, aspheric mirror optical group 230, etc.) in catadioptric system 200 reflect light an even number of times. This eliminates a possibility of image mirroring. First prism 221 reflects light, passing through reticle 201, the first time. Aspheric mirror 231 reflects the light a second time and directs it through beam splitter 220 onto folding mirror 225. Folding mirror 225 reflects the light third time back into second prism 222 of beam splitter cube 220. Second prism 222 reflects light fourth time onto wafer optical group 340 and semiconductor wafer 241. Because the light is reflected an even number of times, the image pattern formed on semiconductor wafer 241 is not mirrored. Furthermore, the amount of light leakage from reticle optical group 210 through beam splitter cube 220 is reduced because of the addition of spacer plate 223 to beam splitter cube 220 in combination with baffle plate 250.

4. Conclusion.

Example embodiments of the methods, systems, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A device manufacturing method, comprising:
   (a) patterning a beam of radiation;
   (b) reflecting the patterned beam first through fourth times, the first and fourth reflections being performed with a beam splitter; and
   (c) projecting the reflected patterned beam onto a target portion of a substrate.

2. The method of claim 1, wherein the first reflection is performed using a prism that is provided within the beam splitter.

3. The method of claim 1, wherein the second reflection is performed using an aspheric mirror.

4. The method of claim 1, wherein the third reflection is performed using a folding mirror.

5. The method of claim 1, wherein the fourth reflection is performed using a prism that is provided within the beam splitter.

6. The method of claim 1, further comprising blocking backscattered light before step (c).

7. The method of claim 1, further comprising polarizing the patterned beam at least one of before, during and after step (b).

8. A system, comprising:
   a patterning device that patterns a beam of radiation;
   a reflecting system that is configured to reflect the patterned beam first through fourth times, the reflecting system including a beam splitter that is configured to perform the first and fourth reflections; and
   a projection system that projects the reflected patterned beam onto a target portion of a substrate.

9. The system of claim 8, wherein the beam splitter comprises a prism, such that the first reflection is performed using the prism.

10. The system of claim 8, wherein the reflecting system includes an aspheric mirror, and the second reflection is performed using the aspheric mirror.

11. The system of claim 8, wherein the reflecting system includes a folding mirror, and the third reflection is performed using the folding mirror.

12. The system of claim 8, wherein the beam splitter comprises a prism, such that the fourth reflection is performed using the prism.

13. The system of claim 8, further comprising:
   a blocking device that blocks backscattered light.

14. The system of claim 10, further comprising:
   at least one polarizing device located at least one of within and adjacent the reflecting system.

* * * * *

UNITED STATES PATENT AND TRADEMARK OFFICE
CERTIFICATE OF CORRECTION

PATENT NO.        : 7,199,862 B2
APPLICATION NO. : 11/272147
DATED             : April 3, 2007
INVENTOR(S)       : Harry Sewell It is certified that error appears in the above-identified patent and that said Letters Patent is hereby corrected as shown below:

Title Page
Item [*] under Notice section, reference to Terminal Disclaimer is missing, please add
--This patent is subject to a terminal disclaimer--.

Signed and Sealed this

Nineteenth Day of August, 2008

JON W. DUDAS
*Director of the United States Patent and Trademark Office*